(12) United States Patent
Groen et al.

(10) Patent No.: US 7,142,014 B1
(45) Date of Patent: Nov. 28, 2006

(54) HIGH FREQUENCY XOR WITH PEAKED LOAD STAGE

(75) Inventors: Eric D. Groen, Ankeny, IA (US); Charles W. Boecker, Ames, IA (US); William C. Black, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 67 days.

(21) Appl. No.: 10/990,047

(22) Filed: Nov. 16, 2004

(51) Int. Cl.
*G06F 7/50* (2006.01)

(52) U.S. Cl. .................. 326/55; 330/253; 327/109; 327/111

(58) Field of Classification Search ............... 326/27, 326/52, 55, 83, 115; 327/109, 110, 111; 330/253
See application file for complete search history.

(56) References Cited

U.S. PATENT DOCUMENTS 5,218,246 A * 6/1993 Lee et al. ................ 326/55

2004/0227573 A1* 11/2004 Soda ..................... 330/253

* cited by examiner

*Primary Examiner*—Daniel Chang
(74) *Attorney, Agent, or Firm*—Tim Harrison; Michael Wallace

(57) ABSTRACT

An apparatus and method of the present invention includes a high frequency exclusive OR (XOR) with a peaked load stage. The peaked load stage coupled to the XOR produces a peaked response at a specified frequency of operation. The high frequency XOR comprises a mixer stage comprising first and second transconductance stages coupled to produce a differential output current. The peaked load stage receives the differential output current from the mixer stage and provides increasing impedance at a specified frequency of operation. The peaked load stage includes a pair of peaked load blocks comprising a saturation region peaked load MOSFET and a resistive load. The gate-to-source capacitance of the peaked load MOSFET is coupled to the resistive load to form a high pass filter that provides additional bias to a gate of the peaked load MOSFET that increases the resistance of the peaked load MOSFET at the specified frequency.

23 Claims, 10 Drawing Sheets programmable logic device 10

FIG. 2 programmable MGT 14 - 28 high frequency XOR high frequency XOR 90 peaked load block 94 with increased Cgs peaked load block 94 peaked load block 94 with selectable resistive element peaked load block 94 with peak setting logic for selectable resistive and capacitive elements gate-to-channel capacitance frequency response without peaked load stage peaked load stage frequency response peaked load exclusive OR method

HIGH FREQUENCY XOR WITH PEAKED LOAD STAGE

BACKGROUND OF THE INVENTION

1. Field of the Invention

This invention relates generally to communication systems and more particularly to high frequency XOR circuits used therein.

2. Description of Related Art

Communication systems are known to transport large amounts of data between a plurality of end user devices, which, for example, include telephones (i.e., land line and cellular), facsimile machines, computers, television sets, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or the Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits-per-second, 100 megabits-per-second, 1 gigabit-per-second and beyond. Synchronous Optical NETwork (SONET), for example, currently provides for up to 10 gigabits-per-second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss of information.

Accurate recovery of information from high-speed serial transmissions typically requires transceiver components that operate at clock speeds equal to or higher than the received serial data rate. As the demand for data throughput increases, so do the demands on a high-speed serial transceiver. The increased throughput demands are pushing some current integrated circuit manufacturing processes to their operating limits. Integrated circuit processing limits (e.g., device parasitics, trace sizes, propagation delays, and device sizes) and integrated circuit (IC) fabrication limits (e.g., IC layout, frequency response of the packaging, and frequency response of bonding wires) limit the speed at which the high-speed serial transceiver may operate without loss of signal contents. Additionally, modern communication systems, including high data rate communication systems, typically include a plurality of circuit boards that communicate with each other by way of signal traces, bundled data lines, backplanes, etc.

At high data rates, the impedance due to series inductance and stray capacitance in the signal traces, backplanes and bonding wires increases. The increased impedance at high data rates causes circuit losses that reduce the magnitude and the high frequency content of the received data. At high data rates, the rise time of the data approaches the propagation time through the transport medium (backplanes, circuit traces, bonding wires, etc.) thus approaching a transmission line wherein the device parasitics are distributed across the transmission line. The distributed parasitics degrade the high frequency content of the high-speed data to the extent that the corners of an idealized square wave become significantly rounded.

Additionally, the distributed parasitics attenuate the high-speed data to the point where recovery of data and/or a clock introduces substantial errors thereby increasing inter-symbol interference and more generally, to result in the data being misread. Exclusive OR gates, among other circuit components, often produce an output signal from a logic circuit (such as a clock and data recovery circuit for high speed applications) that are required to propagate a distance sufficient yet the high frequency related circuit responses introduce high frequency errors as discussed above to result in erroneous readings of signal logic states. There is a need, therefore, for a method and an apparatus to increase the output signal magnitude at the high frequencies at a device level to compensate for the circuit losses. More specifically, this need is acute for XOR logic blocks in specified applications in order for XOR logic block output signals to be properly interpreted.

BRIEF SUMMARY OF THE INVENTION

The present invention includes an apparatus and a method to produce a high frequency exclusive OR (XOR). In an exemplary embodiment the high frequency XOR comprises a mixer stage including first and second transconductance stages coupled to produce a differential current to a peaked load stage that produces a peaked response having an increased output signal magnitude at a specified frequency of operation. The peaked load stage receives the differential current and provides an impedance that increases as a function of frequency to produce the peaked response at the specified frequency of operation.

Each peaked load stage includes a pair of peaked load blocks wherein each peaked load block comprises an N-type peaked load MOSFET and a resistive load coupled to bias the peaked load MOSFET in the saturation region. The gate-to-source capacitance of the peaked load MOSFET is coupled to the resistive load to form a high pass filter that provides additional bias, as a function of frequency, to a gate of the peaked load MOSFET wherein the additional bias increases the resistance of the saturation region peaked load MOSFET thereby producing an increased output signal magnitude at a specified frequency of operation.

In one embodiment of the present invention, the gate-to-source capacitance of the peaked load MOSFET is increased by a capacitor configured MOSFET coupled between the peaked load MOSFET and a differential output node. The gate-to-source and gate-to-drain capacitance of the capacitor configured MOSFET adds to the gate-to-source capacitance of the peaked load MOSFET to extend the frequency response of the peaked load stage. In another embodiment of the present invention, a plurality of selectable capacitive elements is coupled to the peaked load MOSFET and is further coupled to peak setting logic to selectively couple at least one of the capacitive elements to the peaked load MOSFET.

In yet another embodiment of the present invention, a selectable resistive element is coupled in parallel with the resistive load for setting an increased output signal magnitude at a specified frequency of operation. A further embodiment provides for a plurality of selectable resistive elements coupled in parallel with the resistive load and further coupled to the peak setting logic to couple at least one selectable resistive element of the plurality of selectable resistive elements to the peaked load MOSFET.

The high frequency XOR receives high data rate serial data and produces a differential output logic one whenever one, but not both, of a first or second differential input is a logic one. The high frequency XOR produces a differential output logic zero whenever both first and second differential inputs are at similar logic states, either logic one or logic zero.

Each of the first and second differential inputs are defined as a logic one whenever a first terminal of the differential input signal has a greater magnitude than a magnitude of a second terminal of the differential input signal. Each differential input signal is defined as a logic zero whenever the second terminal of the differential input signal has a greater magnitude than the magnitude of the first terminal of the differential input signal.

The above-referenced description of the summary of the embodiments of invention described herein captures some, but not all, of the various aspects of the present invention. The claims are directed to some of the various other embodiments of the subject matter towards which the present invention is directed. In addition, other aspects, advantages and novel features of the invention will become apparent from the following detailed description of various embodiments of the invention when considered in conjunction with the accompanying drawings.

DETAILED DESCRIPTION OF THE INVENTION

Figure 1:
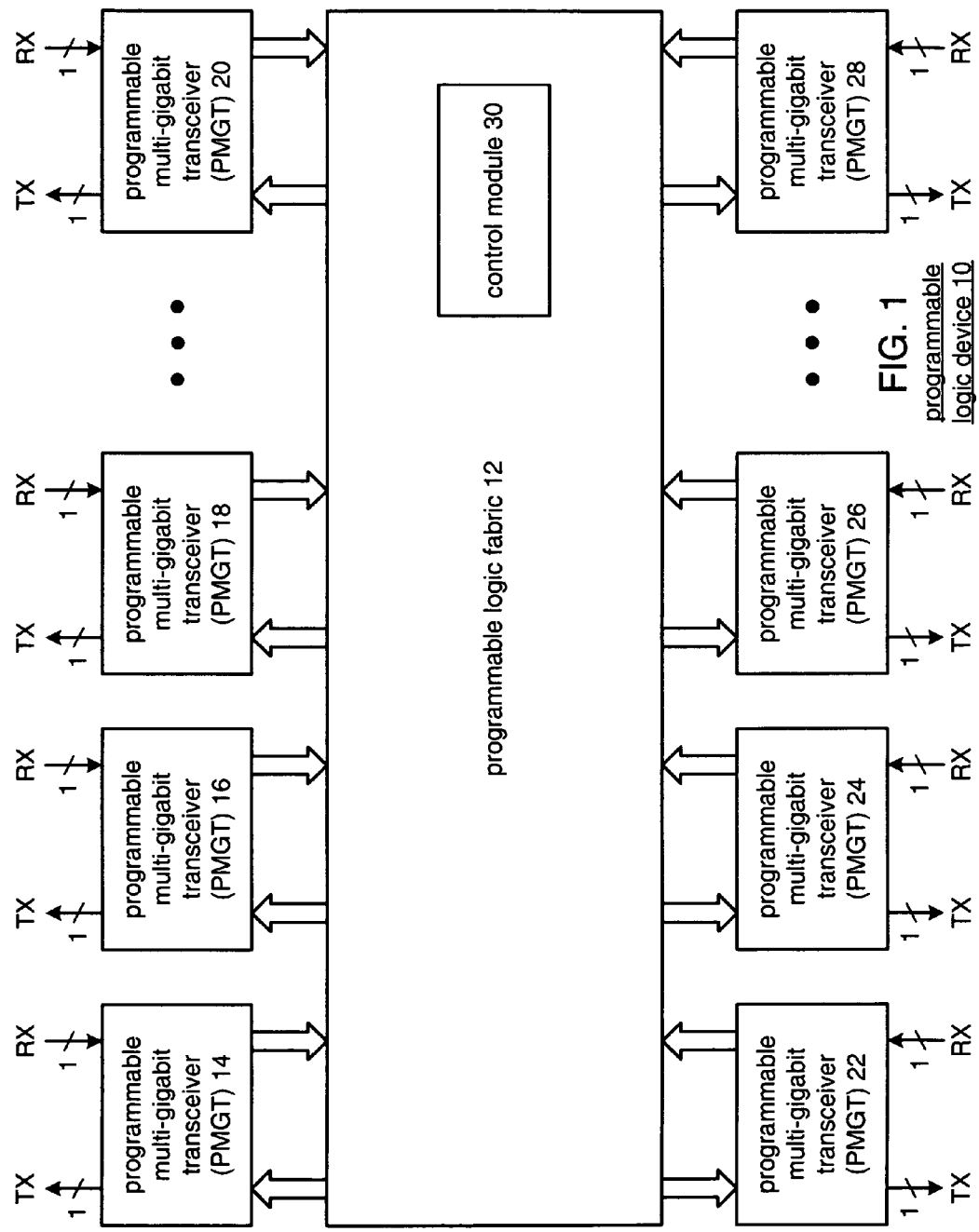
FIG. 1 is a schematic block diagram of a programmable logic device that includes programmable logic fabric, a plurality of programmable multi-gigabit transceivers (PMGTs) and a control module.

FIG. 1 is a schematic block diagram of a programmable logic device 10 that includes programmable logic fabric 12, a plurality of programmable multi-gigabit transceivers (PMGTs) 14–28 and a control module 30. The programmable logic device 10 may be a programmable logic array device, a programmable array logic device, an erasable programmable logic device, and/or a field programmable gate array (FPGA). When the programmable logic device 10 comprises an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, control module 30 generates control signals to program transmit and receive sections of each of the PMGTs 14–28. In general, each of the PMGTs 14–28 performs a serial-to-parallel conversion on receive data and performs a parallel-to-serial conversion on transmit data. The parallel data may be, for instance, 8-bits wide, 16-bits wide, 32-bits wide, or 64-bits wide.

Typically, the serial data will be a 1-bit stream of data that may be a binary level signal, a multi-level signal, etc. Further, two or more programmable multi-gigabit transceivers may be bonded together to provide greater transmitting speeds. For example, if PMGTs 14, 16 and 18 are transceiving data at 3.125 gigabits-per-second, the PMGTs 14, 16 and 18 may be bonded together such that the effective serial data rate is approximately 3 times 3.125 gigabits-per-second.

Each of the programmable multi-gigabit transceivers 14–28 may be individually programmed to conform to separate standards. In addition, the transmit path and receive path of each programmable multi-gigabit transceiver 14–28 may be separately programmed such that the transmit path of a transceiver is supporting one standard while the receive path of the same transceiver is supporting a different standard. Further, the serial data rates of the transmit path and receive path may be programmed, for example, from 1 gigabit-per-second to tens of gigabits-per-second. The size of the parallel data in the transmit and receive sections, or paths, is also programmable and may vary, for instance, from 8-bits, 16-bits, 32-bits, or 64-bits.

Figure 2:
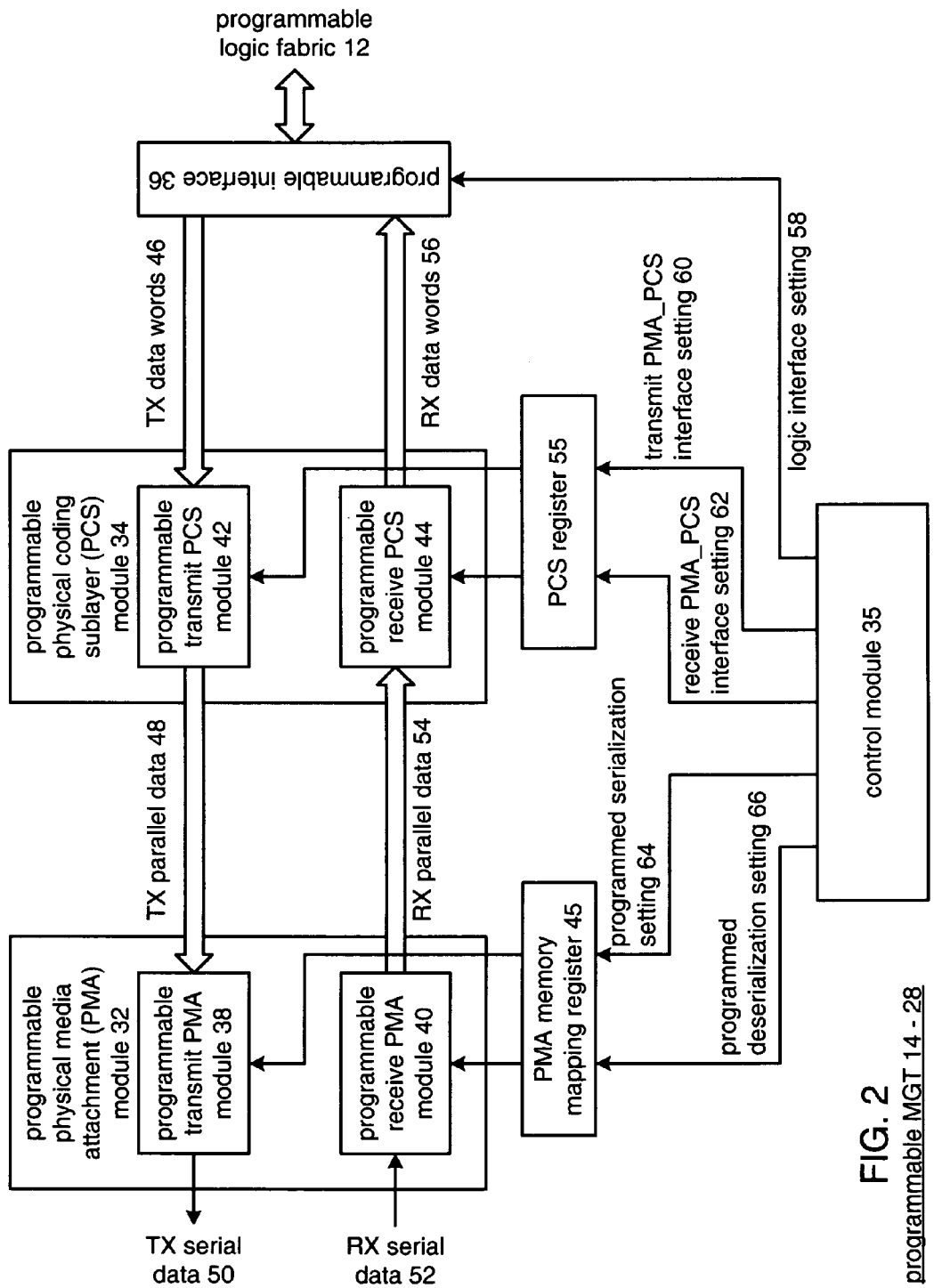
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14–28. As shown, the programmable multi-gigabit transceiver 14–28 includes a programmable physical media attachment (PMA) module 32, a programmable physical coding sublayer (PCS) module 34, a programmable interface 36, a control module 35, a PMA memory mapping register 45 and a PCS register 55. The control module 35, based on the desired mode of operation for the individual programmable multi-gigabit transceiver 14–28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30 of FIG. 1.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58–66.

The programmable PMA module 32 includes a programmable transmit PMA module 38 and a programmable receive PMA module 40. The programmable transmit PMA module 38 is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable PCS module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., one byte, two bytes, three bytes, four bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA module 32 and programmable PCS module 34 may be individually programmed to support a desired data transfer rate. The data transfer rate may be in accordance with a particular standard such that the receive path, i.e., the path through programmable receive PMA module 40 and the programmable receive PCS module 44 may be programmed in accordance with one standard, while the transmit path, i.e., the path through the programmable transmit PCS module 42 and the programmable transmit PMA module 38, may be programmed in accordance with the same or another standard.

Figure 3:
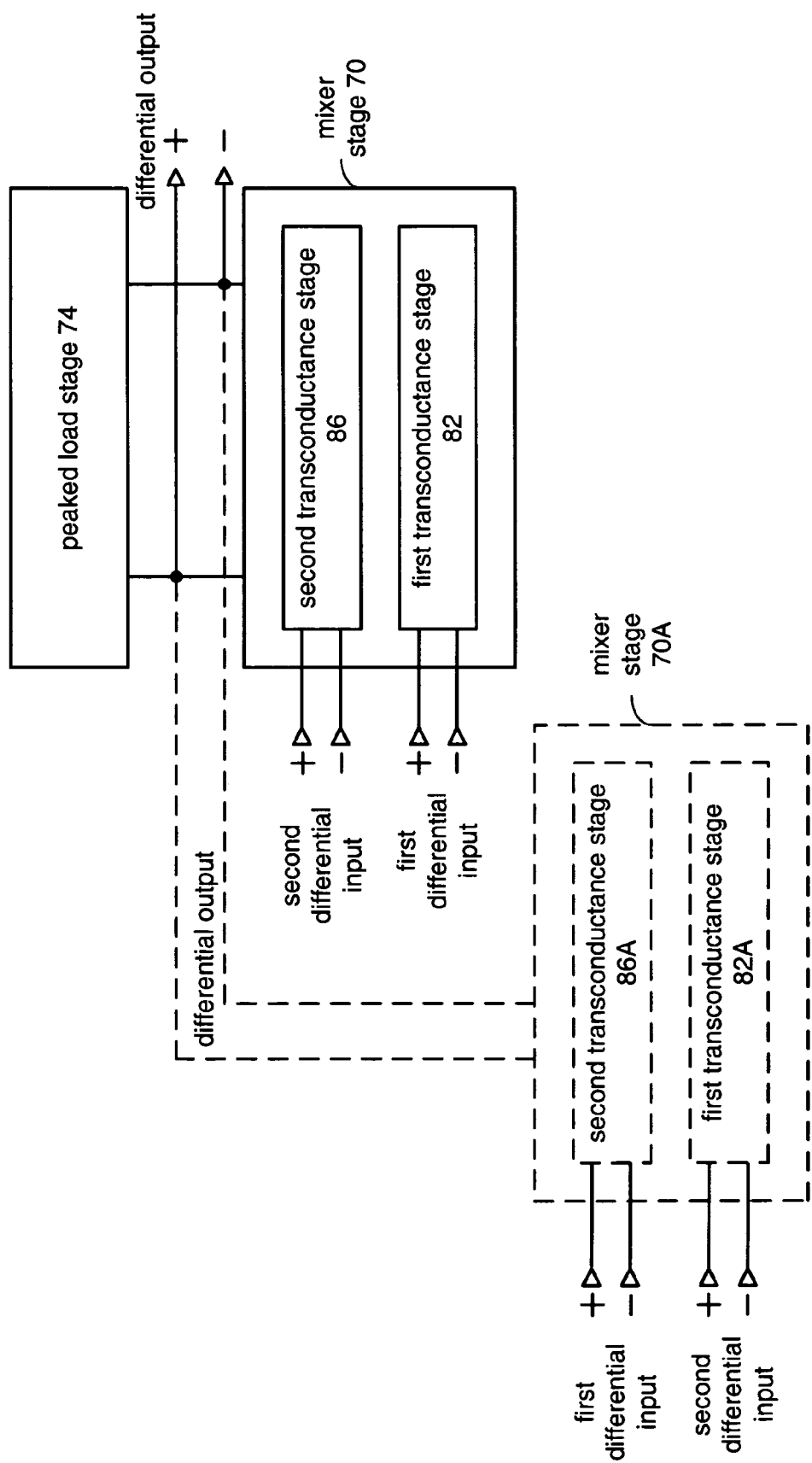
FIG. 3 is a functional block diagram of a high-frequency exclusive OR (XOR) gate according to one embodiment of the present invention.

FIG. 3 is a functional block diagram of a high frequency exclusive OR (XOR) according to one embodiment of the present invention. The high frequency XOR comprises a mixer stage 70, and a peaked load stage 74. Mixer stage 70 further includes a first transconductance stage 82 and a second transconductance stage 86. Mixer stage 70 mixes or multiplies the current produced by first transconductance stage 82 with the current produced by second transconductance stage 86. One of ordinary skill in the art will recognize mixer stage 70 as a Gilbert mixer or Gilbert multiplier. When the first and second differential input signals have relatively small but equal input amplitudes, the circuit functions as a linear multiplier and can achieve mixing and modulation. When the input signals are relatively large and of approximately equal amplitude, the Gilbert is operable as an exclusive OR gate for differential inputs as shown here in FIG. 3 (as well as FIG. 4) and may be used as a phase detector in high-speed applications. When used as a phase detector in the high-speed multi-gigabit transceivers of FIG. 1, the peaking function of the present invention reduces inter-symbol interference which increases the accuracy of recovered data in high-speed serial data applications and further reduces transmission errors. One of average skill in the art may readily appreciate the multiple operational characteristics of Gilbert mixers.

The high frequency XOR of FIG. 3 produces a differential logic one output when either one of the first or second differential input signals are a differential logic one. The high frequency XOR differential output is a logic zero whenever both first and second differential input signals are at similar logic levels (logic zero or logic one). This function is used in phase detectors as a transition detector to detect a lack of transition in the incoming high-speed serial data. The lack of transition in the incoming high-speed serial data can cause, if left undetected, unnecessary changes in a phase-locked loop voltage controlled oscillator (VCO) frequency thereby increasing phase noise in the VCO output.

Peaked load stage 74 sets the peaking function of the high frequency XOR at the specified frequency of operation. A resistance and a capacitance in peaked load stage 74 create a high pass filter that produces a peaked response at the specified frequency of operation. In one embodiment of the present invention, the specified frequency is approximately 4 GHz to 5 GHz. The operation of the peaked load stage will be discussed in the following figures.

In one embodiment of the present invention, the high frequency XOR includes a first and second mixer stage, each including first and second transconductance stages. The circuitry within the second mixer stage is similar to the first mixer stage. Accordingly, descriptions below in relation to FIG. 4 and the figures that follow apply with equal force to the second mixer stage. Such circuitry is not being explicitly shown to avoid unnecessary duplicative explanations.

The second mixer stage 70A is shown in dashed lines in FIG. 3 as well as the first and second transconductance stages 82A and 86A, respectively of second mixer stage 70A. The first mixer stage 70 operates as previously described while the second mixer stage 70A receives differential inputs reversed relative to the first mixer stage. More specifically, the first transconductance stage 82A of the second mixer stage 70A is coupled to receive the second differential input while the second transconductance stage 86A of the second mixer stage 70A is coupled to receive the first differential input. Additionally, the first and second differential MOSFET pair of the second transconductance stage of the second mixer stage receives opposite phases of the differential inputs relative to the first and second differential MOSFET pair of the second transconductance stage of the first mixer stage (as illustrated in greater detail in FIG. 4 below). The dual mixers with opposite differential inputs function to maintain symmetrical delays through the first and second transconductance stages of the first and second mixers.

Figure 4:
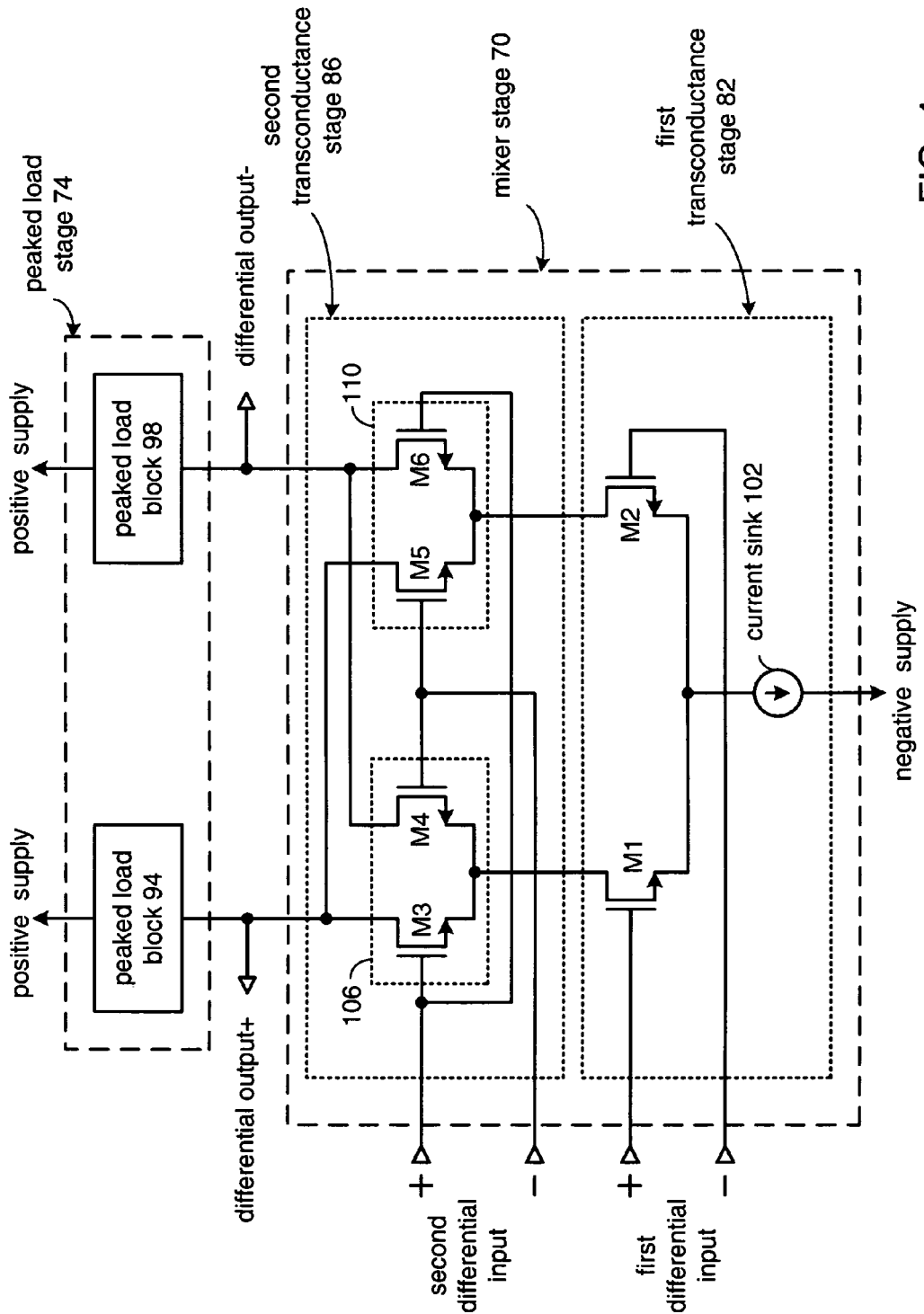
FIG. 4 is a schematic block diagram of a high frequency exclusive OR (XOR) according to one embodiment of the present invention.

FIG. 4 is a schematic block diagram of a high frequency exclusive OR (XOR) according to one embodiment of the present invention. High frequency XOR 90 comprises mixer stage 70, including first transconductance stage 82 and second transconductance stage 86, and peaked load stage 74. Peaked load stage 74 further includes a pair of peaked load blocks, namely, peaked load block 94 and peaked load block 98.

First transconductance stage 82 includes a pair of N-type MOSFETs coupled to receive a first differential input and further having commonly coupled sources that are further coupled to a current sink 102 that provides a bias level for mixer stage 70. A first input MOSFET M1 of the pair of N-type MOSFETs is coupled to receive, on a gate, a first phase of the first differential input and produces a corresponding current from a drain to second transconductance stage 86. Similarly, a second input MOSFET M2 of the pair of N-type MOSFETs is coupled to receive, on a gate, a second terminal of the first differential input and produces a corresponding current from a drain to the second transconductance stage 86.

Second transconductance stage 86 includes a first differential MOSFET pair 106 comprising a first MOSFET M3 and a second MOSFET M4, and a second differential MOSFET pair 110 comprising a first MOSFET M5 and a second MOSFET M6. First MOSFET M3 and second MOSFET M4 have commonly coupled sources that are coupled to the drain of first input MOSFET M1 of first transconductance stage 82. First MOSFET M5 and second MOSFET M6 of second differential MOSFET pair 110 have commonly coupled sources that are further coupled to the drain of second input MOSFET M2 of first transconductance stage 82. First MOSFET M3 is coupled to receive, on a gate, a first terminal of a second differential input while second MOSFET M4 is coupled to receive, on a gate, a second terminal of the second differential input. First MOSFET M5 and second MOSFET M6 of second differential MOSFET pair 110 are also coupled to receive, on a gate, the second terminal and the first terminal of the second differential input, respectively. Each of the first MOSFETs, namely, first MOSFET M3 and first MOSFET M5, of second transconductance stage 86, have commonly coupled drains that are further coupled to a first differential output node and are further coupled to peaked load block 94 of peaked load stage 74. In a similar fashion, second MOSFET M4 and second MOSFET M6 of second transconductance stage 86 have commonly coupled drains that are coupled to a second differential output node and are further coupled to peaked load block 98 of peaked load stage 74.

Each differential input, namely, the first differential input of first transconductance stage 82 and the second differential input of second transconductance stage 86, is a logic one when the first terminal has a magnitude that is greater than a magnitude of the second terminal. Conversely, each differential input is a logic zero when the first terminal magnitude is less than the magnitude of the second terminal. As is known to one of average skill in the art, an XOR gate produces a logic one output when either, but not both, of a first input or a second input is a logic one. The XOR gate produces a logic zero when the first input and second input are at similar logic states, either logic one or logic zero. High frequency XOR 90 of FIG. 4 produces a differential logic one when either, but not both, of the first differential input or the second differential input is logic one and produces a differential logic zero when both first and second differential inputs are at similar logic states, either logic one or logic zero.

One aspect of the present invention is to provide an increased output signal magnitude at the specified frequency of operation in order to extend the high frequency response. The impedance of peaked load stage 74 increases as a function of increasing frequency. The differential output magnitude increases with the increasing impedance thus providing a peaked response at the specified frequency of operation.

Figure 5:
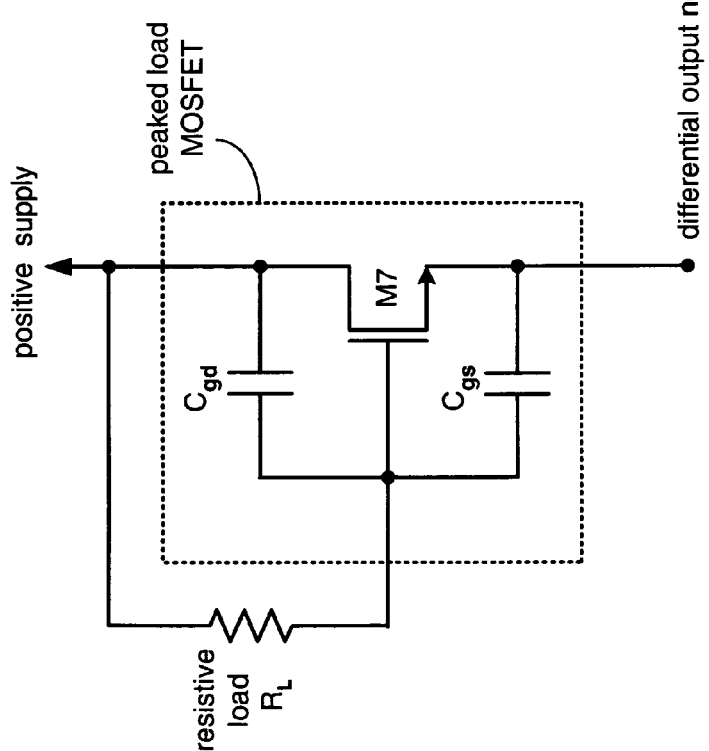
FIG. 5 is a schematic block diagram of a peaked load block in one embodiment of the present invention.

FIG. 5 is a schematic block diagram of peaked load block 94 in one embodiment of the present invention. As was discussed with respect to FIG. 4, the peaked load stage comprises a substantially identical pair of peaked load blocks. Since both peaked load blocks are substantially identical, the following discussion applies equally to peaked load block 94 and peaked load block 98. Peaked load block 94 of FIG. 4 is coupled to receive current from the mixer stage (mixer stage 70 of FIG. 4), and produces a voltage proportional to the received current at the differential output node and additionally provides the peaked response at the specified frequency of operation. Peaked load block 94 comprises a peaked load MOSFET M7 biased in the saturation region and that is coupled between a positive supply and the differential output node. The differential output node is further coupled to the drains of first MOSFETs M3 and M5 of the second transconductance stage 86 shown in FIG. 4.

Resistive load $R_L$, is coupled between the positive supply and the gate of peaked load MOSFET M7. A gate-to-source capacitance (Cgs) is shown coupled between the gate and source of peaked load MOSFET M7 while a gate-to-drain capacitance (Cgd) is shown coupled between the gate and the drain of peaked load MOSFET M7. As is known to one of average skill in the art, Cgs and Cgd are formed internal to peaked load MOSFET M7. For the purposes of discussion, however, Cgs and Cgd are shown as separate elements connected to peaked load MOSFET M7.

Resistive load $R_L$, when coupled to Cgs of peaked load MOSFET M7, forms a high pass filter that couples, as a function of frequency, increasing levels of the differential output as positive feedback to the gate of peaked load MOSFET M7. The positive feedback increases the bias on peaked load MOSFET M7 which further increases a saturation region resistance for MOSFET M7. The increased resistance of peaked load MOSFET M7 thus produces a peaked response at the specified frequency of operation.

To set the specified frequency of operation, resistive load $R_L$ is set, in one embodiment of the invention, to approximately 186 Ohms. With a typical Cgs value of approximately 90 femtofarads and a specified frequency of operation that is between 4 GHz and 5 GHz, the value of $R_L$ is selected to achieve the specified frequency of operation within a frequency range compatible with the value of Cgs.

In one embodiment of the present invention, a selectable resistive element is coupled in parallel with resistive load $R_L$ to change the frequency of the peaked response. In an alternate embodiment, the value of Cgs is selectable to change the frequency of the peaked response.

One drawback of the aforementioned internal Cgd is the shunting effect it has on the gate bias provided by Cgs. This shunting effect is caused by the capacitive voltage divider formed by Cgs and Cgd which reduces the gate bias on peaked load MOSFET M7 thereby reducing the peaked response. One embodiment of the present invention increases the effective capacitance of Cgs to compensate for the shunting effect of Cgd.

Figure 6:
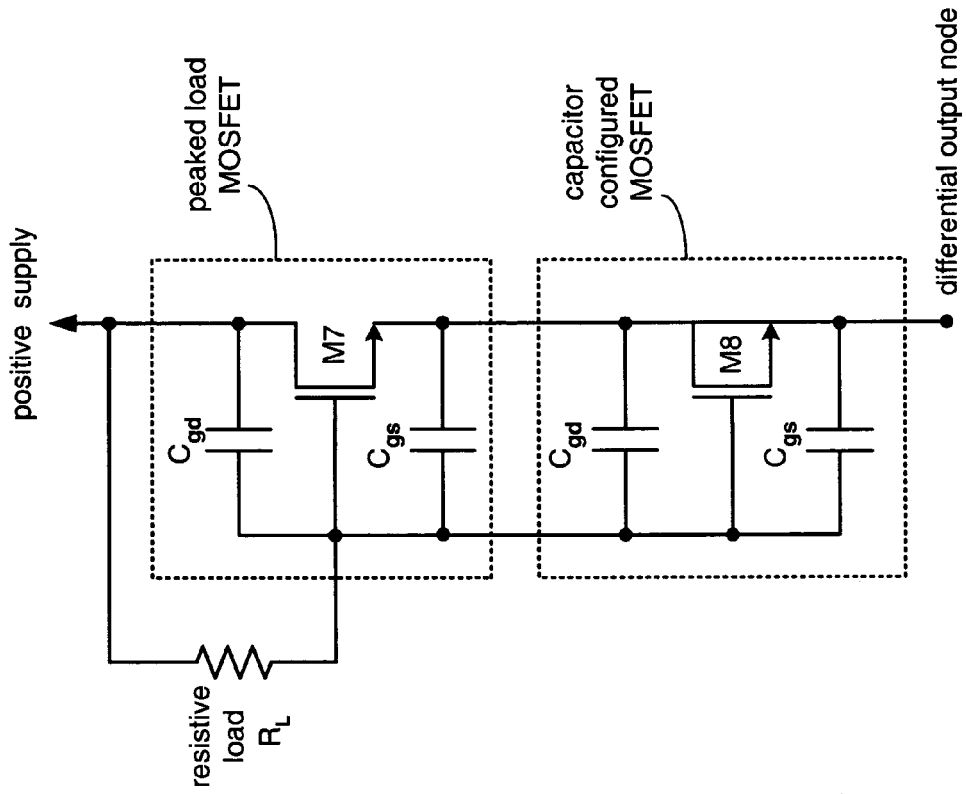
FIG. 6 is a schematic block diagram of a peaked load block with increased Cgs according to one embodiment of the present invention.

FIG. 6 is a schematic block diagram of peaked load block 94 with increased Cgs according to one embodiment of the present invention. Peaked load block 94 includes peaked load MOSFET M7, resistive load $R_L$, and a capacitor configured MOSFET M8. Capacitor configured MOSFET M8 has a drain connected to the source of peaked load MOSFET M7, a gate coupled to the gate of peaked load MOSFET M7, and a source coupled to the differential output node. As can be seen in FIG. 6, a Cgs and a Cgd of capacitor configured MOSFET M8 are coupled in parallel with the Cgs of peaked load MOSFET M7. As is known to one of average skill in the art, parallel coupled capacitors create a total capacitance that is the sum of all the parallel coupled capacitors. The parallel coupled capacitors, namely, Cgs and Cgd of capacitor configured MOSFET M8 and the Cgs of peaked load MOSFET M7, increases the total capacitance coupled between the differential output node and the gate of peaked load MOSFET M7 which reduces the shunting affect caused by the Cgd of peaked load MOSFET M7 by changing the ratio of the capacitive voltage divider. The increased Cgs of peaked load MOSFET M7 also increases the corner frequency of the high pass filter formed by the increased Cgs capacitance of peaked load MOSFET M7 and resistive load $R_L$.

The capacitor configured MOSFET M8 of FIG. 6 is formed, in one embodiment, with a channel length and channel width that is approximately four to five times greater than the corresponding channel length and channel width of peaked load MOSFET M7. The larger channel length and channel width increases the Cgs and Cgd of capacitor configured MOSFET M8 thereby creating a larger capacitor coupled in parallel with the Cgs of peaked load MOSFET M7. The total capacitance formed by capacitor configured MOSFET M8 and the Cgs of peaked load MOSFET M7 couples approximately 90% of the feedback bias to the gate of peaked load MOSFET M7 thus greatly reducing the shunting affects of Cgd.

Figure 7:
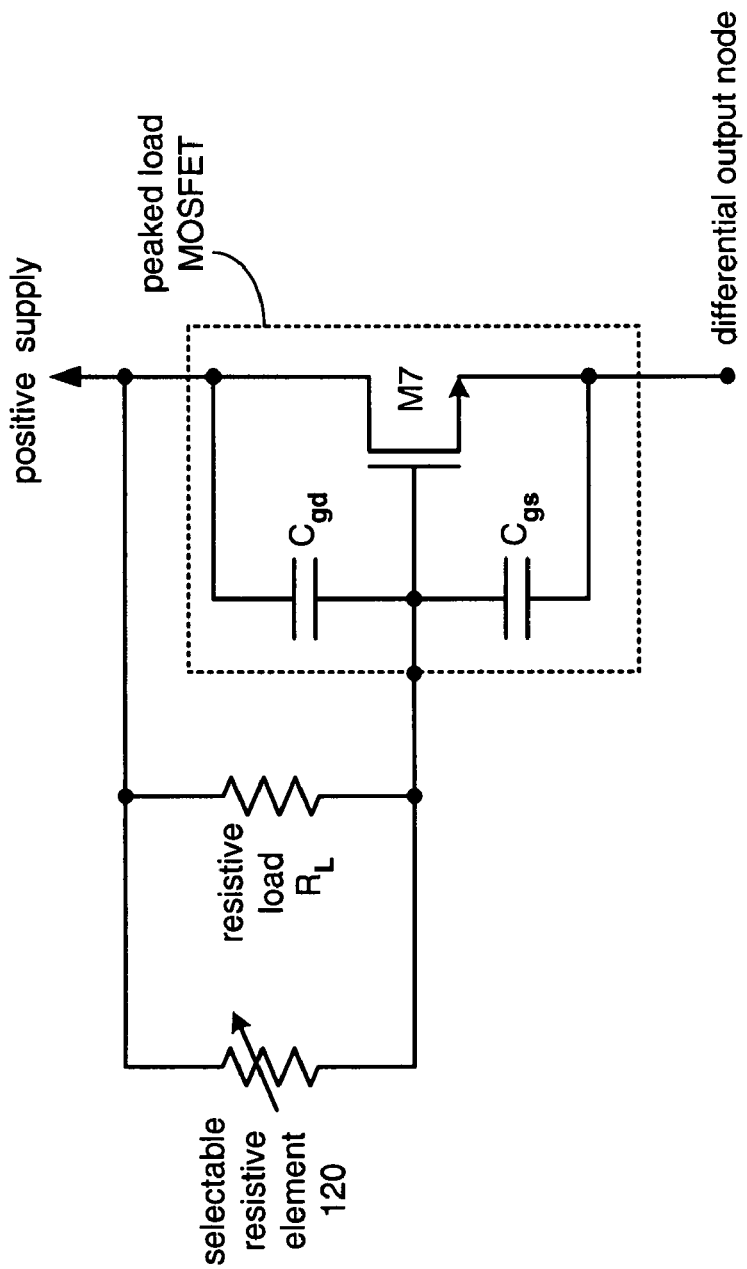
FIG. 7 is a schematic block diagram of a peaked load block with a selectable resistive element according to one embodiment of the present invention.

FIG. 7 is a schematic block diagram of peaked load block 94 with a selectable resistive element according to one embodiment of the present invention. As can be seen in FIG. 7, selectable resistive element 120 is coupled in parallel with resistive load $R_L$. As is known to one of average skill in the art, two resistors coupled in parallel have an effective resistance that is less than either of the two resistors individually. Selectable resistive element 120 is selected, therefore, to have a range of resistance wherein resistive load $R_L$ defines an upper limit of the specified frequency of operation while selectable resistive element 120 is selected to set a lower limit on the specified frequency of operation on the high-pass filter configuration. As is further known to one of average skill in the art, selectable resistive element 120 can be formed to be a triode region MOSFET or as a discrete resistive element.

When formed as a triode region MOSFET, a bias signal (not shown) coupled to the gate of the triode region MOSFET will effectively turn the MOSFET ON and OFF. When turned OFF, the MOSFET has a very high resistance. When turned ON, the MOSFET is biased to have a resistance that, when coupled in parallel with resistive load $R_L$, produces a desired parallel resistance. The desired parallel resistance and Cgs of peaked load MOSFET M7 defines a high frequency pole at the specified frequency of operation. In this embodiment, coupling selectable resistive element 120 into and out of the peaked load block 94 switches between two high pass filter poles. This function is useful when a lower frequency filter pole is needed for a fast response while a high frequency filter pole is needed for the peaked response. For example, when the programmable multi-gigabit transceivers (PMGT 14–28 of FIG. 1) first power up, the fast response may be needed to reach steady state operation so the low frequency filter pole is selected ($R_L$ in parallel with selectable resistive element 120). During steady state operations the high frequency pole is selected ($R_L$ only) to set the peaked response at the specified frequency of operation.

Figure 8:
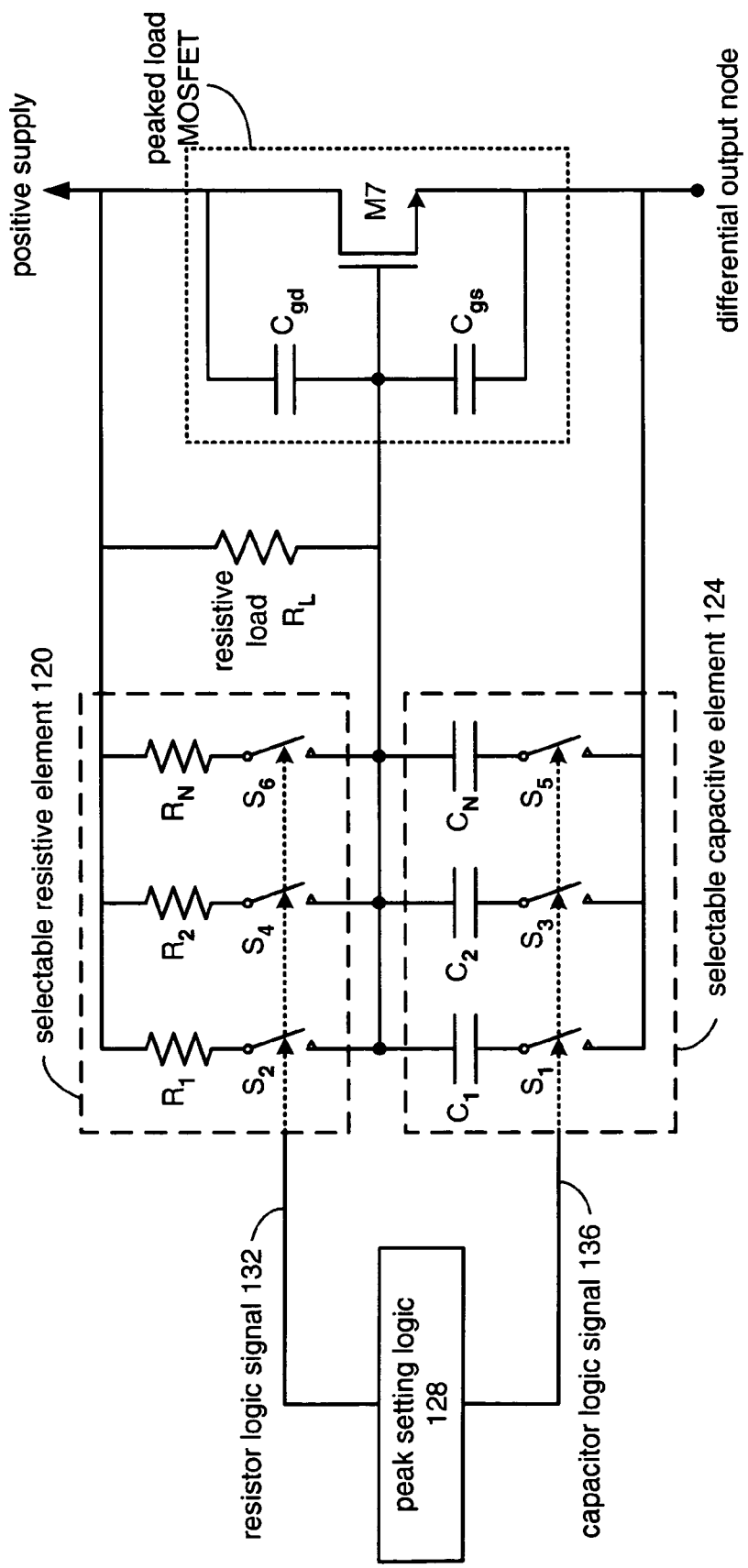
FIG. 8 is a schematic block diagram of a peaked load block with peak setting logic for selectable resistive and capacitive elements, according to one embodiment of the present invention.

FIG. 8 is a schematic block diagram of a peaked load block with peak setting logic for selectable resistive and capacitive elements, according to one embodiment of the present invention. Peaked load block 94 includes peaked load MOSFET M7, a selectable resistive element 120 coupled in parallel with resistive load $R_L$, a selectable capacitance element 124 coupled from the differential output node to the gate of peaked load MOSFET M7, and a peak setting logic 128.

Peak setting logic 128 generates a resistor logic signal 132 and a capacitor logic signal 136 to selectively couple individual resistive and capacitive elements comprising selectable resistive element 120 and selectable capacitive element 124, respectively. As can be seen in FIG. 8, a plurality of resistive elements, namely, R1, R2, and $R_N$ are selectively coupled in parallel with resistive load $R_L$ by resistor logic signal 132. Similarly, a plurality of capacitive elements, namely, C1, C2, and $C_N$, are selectively coupled in parallel with the Cgs of peaked load MOSFET M7 by capacitor logic signal 136. Peak setting logic 128 selectively adjusts the high frequency pole of the high-pass filter formed by the total resistance and total capacitance coupled to peaked load MOSFET M7 thereby setting the peaked response at the specified frequency of operation.

As was previously discussed, each of the capacitive elements of selectable capacitive element 124 are formed as capacitor configured MOSFETs wherein the Cgs and Cgd of the selectively coupled capacitive element effectively sums with the Cgs of peaked load MOSFET M7 to further set the peaked response at the specified frequency of operation. A plurality of switches, namely, switches S1 through S6, selectively couple the plurality of resistive and capacitive elements according to the logic level of resistor logic signal 132 and capacitor logic signal 136. As is known to one of average skill in the art, switches S1 through S6 are formed as MOSFET devices wherein resistor logic signal 132 and capacitor logic signal 136 bias the MOSFET devices to a very low impedance state when the switch is closed and bias the MOSFET devices to a very high impedance state when the switch is open.

Peak setting logic 128, formed in programmable logic fabric (programmable logic fabric 12 of FIG. 1) operates under one of manual or automatic control to selectively couple the individual resistive elements of selectable resistive element 120 and individual capacitive elements of selectable capacitive element 124 to set a desired high pass filter pole in order to provide the peaked response at the specified frequency of operation.

Figure 9:
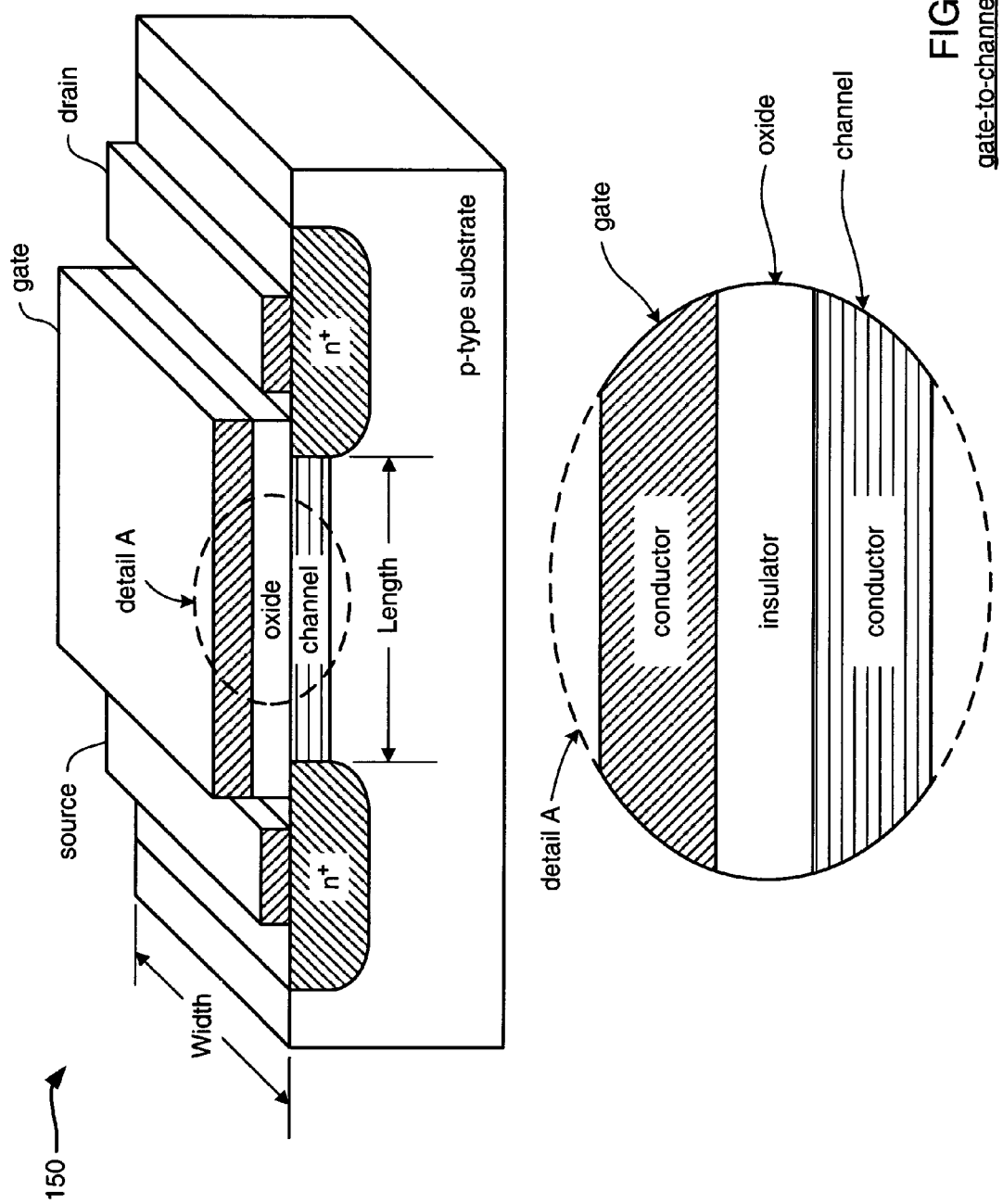
FIG. 9 is a schematic block diagram illustrating gate-to-channel capacitance in an N-channel MOSFET.

FIG. 9 is a schematic block diagram illustrating gate-to-channel capacitance in an N-channel MOSFET for the triode condition. A capacitor is formed when two parallel plate conductors separated by an insulator are charged with a voltage potential. The capacitance is directly proportional to the area of the parallel plates and inversely proportional to the distance separating the parallel plates. As shown generally at 150, the NMOS channel MOSFET is formed by depositing two heavily doped n-type (n+) regions on a p-type substrate. An insulating oxide layer is deposited on the p-type substrate connecting the two n+ regions. A conducting material is deposited on the oxide layer to create the gate. A source and drain are created by depositing a conductive material over the two n+ regions.

When a positive voltage is applied to the gate, a conductive channel is formed in the p-type substrate beneath the oxide layer thereby creating a conduction channel between the drain and source. As can be seen in detail A of FIG. 9, this creates a pair of parallel conductors (gate and channel) separated by an insulator (oxide layer), i.e., a capacitor. The capacitance of the gate-to-channel capacitor is directly proportional to the width and length of the channel and inversely proportional to the oxide layer thickness. In one embodiment of the invention, the width of the channel is formed to be 100 microns, while the length of the channel is formed to be 0.3 microns so as to yield a more predictable capacitive value than is provided by the minimum capacitive value of typical IC processes.

When MOSFET 150 is biased in the triode region, the channel is substantially of uniform depth from the drain to the source, thus forming a substantially uniform gate-to-channel capacitance from the drain to the source. In the triode region, therefore, the gate-to-channel capacitance is distributed equally between the gate-to-source and gate-to-drain capacitances. Stated differently, the gate-to-source capacitance is substantially equal to the gate-to-drain capacitance.

Figure 10A:
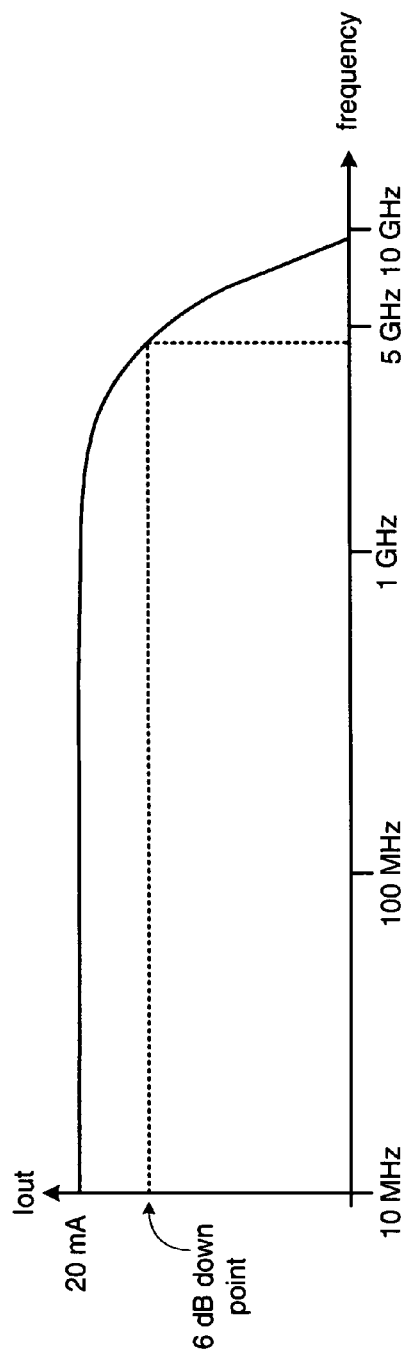
FIGS. 10A and 10B are graphs of the high frequency XOR frequency response without and with the peaked load stage, respectively.
Figure 10B:
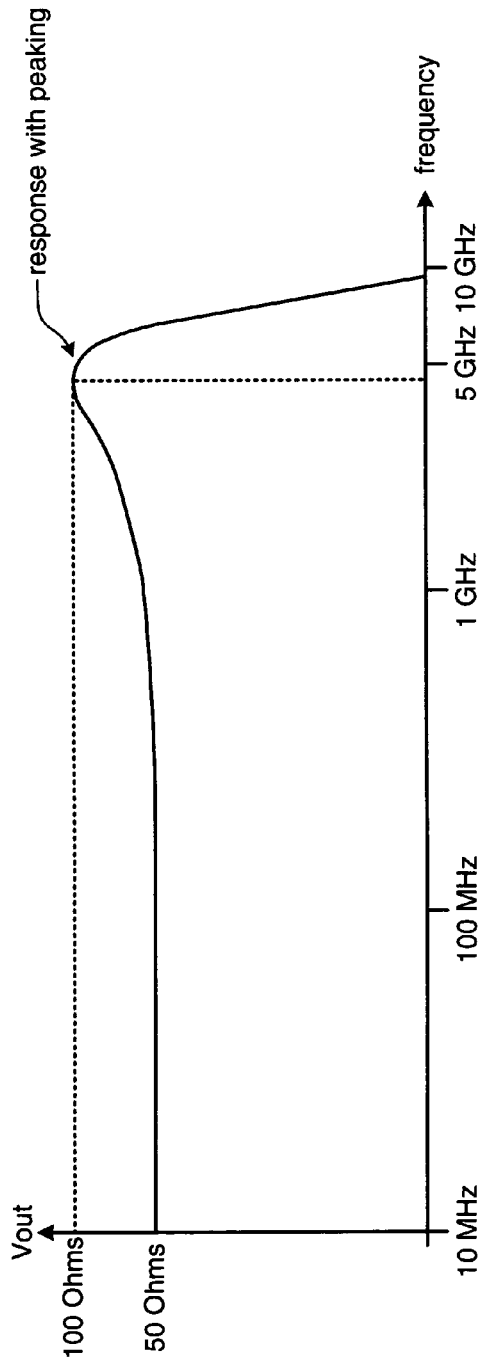

FIGS. 10A and 10B are graphs of the high frequency XOR frequency response without and with the peaked load stage, respectively. As was previously discussed, one aspect of the present invention is to increase the output signal magnitude at the specified frequency of operation to compensate for circuit losses. The peaked load stage in the high frequency XOR provides the required impedance at the desired operating frequency.

FIG. 10A illustrates the differential current response produced by the mixer stage without the peaked load stage. The output signal magnitude begins to roll off around 1 GHz and is approximately 6 dB down between 4 GHZ and 5 GHz. Frequency response in filters (high, low, or band-pass) is typically specified at a corner frequency defined as the half power point where the output power drops by 3 dB from the reference power. When the output is represented as voltage or current, the corner frequency is defined as a 6 dB drop from the reference voltage or current. When coupled into a standard resistive load (typically 50 Ohms), the output voltage magnitude would exhibit substantially the same roll off.

As can be seen in FIG. 10B, however, the output signal magnitude peaks at the specified frequency of operation between 4 GHz and 5 GHz determined by the positive feedback produced by the high pass filter formed by the total Cgs of peaked load MOSFET M7 (peaked load MOSFET M7 of FIG. 5) including any selectable capacitive elements, and the total resistive load (resistive load in parallel with any selectable resistive elements). In one embodiment, the peaked load stage is configured to have an impedance of 50 Ohms at low frequency that increases to 100 Ohms at the specified frequency. The increased impedance is due to the increased bias on the gate of peaked load MOSFET M7 provided by positive feedback coupled from the differential output node by Cgs. As can further be seen in FIG. 10B, the magnitude of the frequency response rolls off at higher frequencies where the inherent high frequency circuit losses exceed the peaked response of the peaked load stage. One of average skill in the art will recognize that the graphs of FIGS. 10A and 10B are exemplary and further represent ideal frequency response with no ripple in the pass band and a smooth roll off from the peak without ringing.

Figure 11:
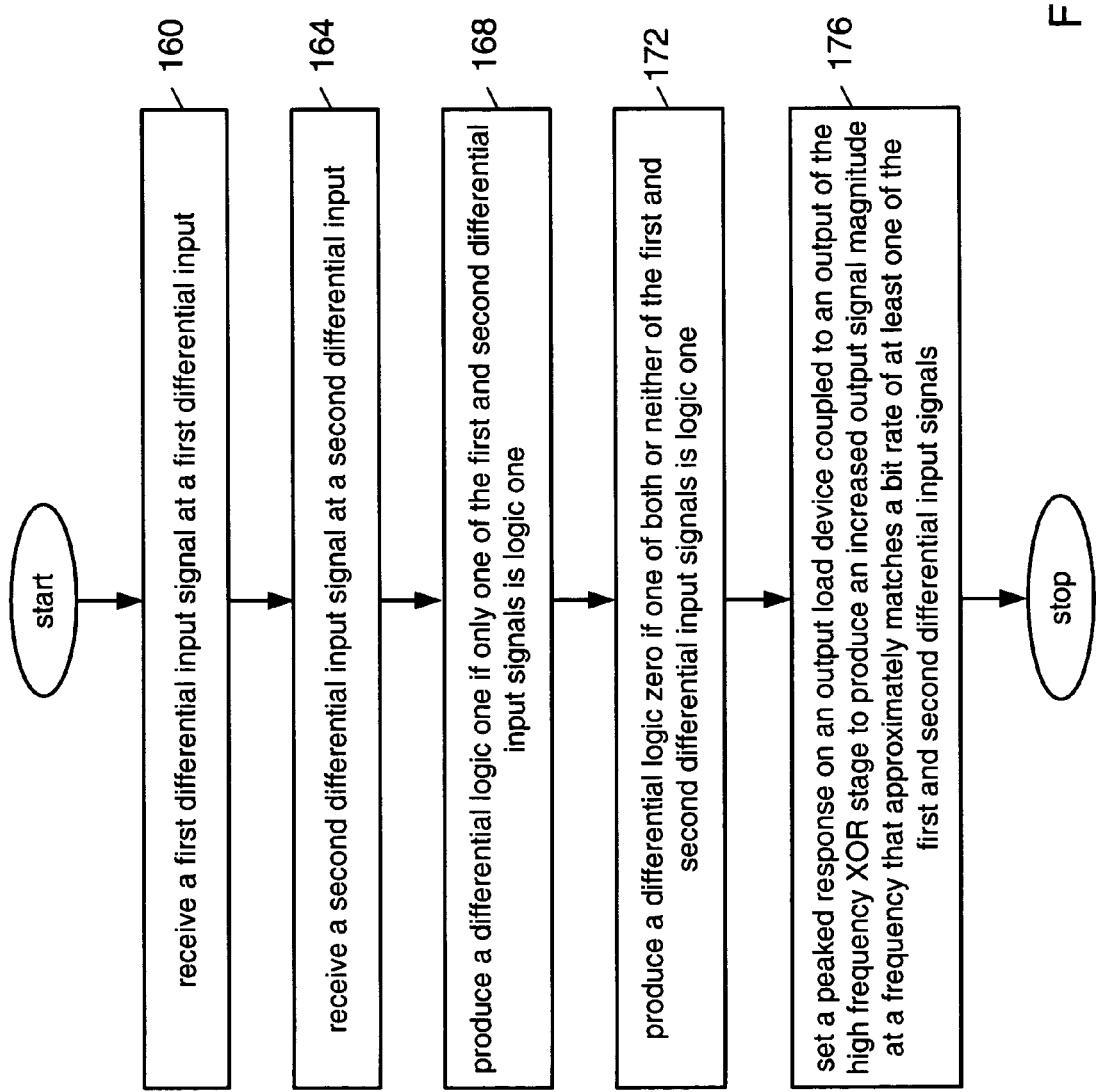
FIG. 11 is a flowchart of a peaked load method in a high frequency XOR according to one embodiment of the present invention.

FIG. 11 is a flowchart of a peaked load method in a high frequency XOR according to one embodiment of the present invention. A first differential input receives a first differential input signal (step 160) and a second differential input receives a second differential input signal (step 164). In the differential mode, a differential signal is considered a logic one whenever a first terminal of the differential signal has a greater magnitude than a magnitude of a second terminal of the differential signal. The differential signal is considered a logic zero whenever the first terminal of the differential signal has a smaller magnitude than the magnitude of the second terminal of the differential signal. The XOR method produces a differential logic one if only one of the first and second differential input signals is a logic one (step 168). The XOR method produces a differential logic zero if the first and second differential input signals are logic one or if neither the first and second differential input signals are logic one (step 172). Stated differently, the XOR function produces the logic one only if both differential input signals are at different logic states and produces the differential logic zero when both differential inputs are at similar logic stages.

One aspect of the present invention is to produce the peaked response at the specified frequency of operation wherein the specified frequency of operation is substantially equal to the highest expected frequency of the first or second differential signals. The peaked XOR method sets the peaked response on an output load device coupled to an output of the high frequency XOR to produce an increased output signal magnitude at a frequency that approximately matches a bit rate of at least one of the first and second differential input signals (step 176).

As was previously discussed, the peaked response is produced by the high pass filter formed by the total resistance and total capacitance coupled across each peaked load MOSFET in the peaked load stage. The high pass filter functions to increase the gate bias on the peaked load MOSFET which increases the triode region resistance as a function of frequency. The total resistance and capacitance values are selected to produce the peaked response in the differential output signal at the specified frequency of operation.

The various embodiments of the invention disclosed herein are susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. Exclusive OR (XOR) logic circuitry for high frequency operations, comprising:
   a mixer stage coupled to receive a first and a second differential input;
   a peaked load stage coupled to the mixer stage for producing a peaked response at a specified frequency of operation, the peaked load stage for increasing impedance at the specified frequency;
   wherein a differential output coupled at a pair of nodes that couple the mixer stage and the peaked load stage produces an increased output signal magnitude based on the increased impedance, the output signal representing one of a logic one or a logic zero at the specified frequency; and wherein the peaked load stage comprises first and second peaked load blocks, the first and second peaked load blocks including a resistive load coupled in parallel with at least one selectable resistive element.

2. The XOR logic circuitry of claim 1 wherein the mixer stage comprises a Gilbert mixer.

3. The XOR logic circuitry of claim 1 wherein the resistive load is coupled across a gate and a drain of a field effect transistor (FET).

4. The XOR logic circuitry of claim 3 wherein the FET is an N-type MOSFET.

5. The XOR logic circuitry of claim 3 wherein the at least one selectable resistive element is coupled to peak setting logic for setting the specified frequency of operation for the increased output signal magnitude.

6. The XOR logic circuitry of claim 5 wherein each of the first and second peaked load blocks further comprises a selectable capacitive element coupled across a source and the gate of the field effect transistor and wherein the selectable capacitive element is coupled to the peak setting logic for setting a desired capacitive value for the specified frequency of operation for the increased output signal magnitude.

7. The XOR logic circuitry of claim 6 wherein the selectable capacitive element comprises a capacitor.

8. Exclusive OR (XOR) logic circuitry for high frequency operations, comprising:
a first transconductance stage for receiving a first differential input;
a second transconductance stage for receiving a second differential input;
a peaked load stage coupled to a supply, wherein the second transconductance stage is coupled between the peaked load stage and the first transconductance stage;
wherein a differential output coupled between the second transconductance stage and the peaked load stage produces an increased output signal magnitude representing one of a logic one or a logic zero at a specified frequency; and
wherein the peaked load stage comprises a pair of peaked load blocks, the pair of peaked load blocks including a resistive load coupled in parallel with at least one selectable resistive element.

9. The XOR logic circuitry of claim 8 wherein the first transconductance stage comprises a pair of N-type MOSFETs having gates coupled to receive the first differential input and further having commonly coupled sources that are further coupled to a current sink coupled to a negative supply.

10. The XOR logic circuitry of claim 9 wherein the second transconductance stage comprises a first differential MOSFET pair and a second differential MOSFET pair of N-type MOSFETs having gates coupled to receive the second differential input, wherein each differential MOSFET pair has commonly coupled sources and wherein the commonly coupled sources of the first differential MOSFET pair are coupled to a drain of a first input MOSFET of the pair of MOSFETs of the first transconductance stage and wherein the commonly coupled sources of the second differential MOSFET pair are coupled to a drain of a second input MOSFET of the pair of MOSFETs of the first transconductance stage.

11. The XOR logic circuitry of claim 10 wherein the first and second differential MOSFET pair each comprises first and second MOSFETs and further wherein drains of the first MOSFET of the first and second differential MOSFET pair are commonly coupled to a first differential output node and wherein drains of the second MOSFETs of the first and second differential MOSFET pair are commonly coupled to a second differential output node.

12. The XOR logic circuitry of claim 11 wherein each peaked load block includes an N-type peaked load MOSFET having a drain coupled to a supply and a source that is coupled to one of the first or second differential output nodes.

13. The XOR logic circuitry of claim 12 wherein the resistive load is coupled to a gate of the peaked load MOSFET and the supply.

14. The XOR logic circuitry of claim 12 wherein the at least one selectable resistive element is operably coupled to peak setting logic for selecting an impedance and a corresponding voltage level at the specified frequency.

15. The XOR logic circuitry of claim 12 wherein each peaked load block includes at least one selectable capacitive element coupled across the gate and the source of the peaked load MOSFET.

16. The XOR logic circuitry of claim 15 wherein the at least one selectable capacitive element comprises a capacitor.

17. The XOR logic circuitry of claim 16 wherein the at least one selectable capacitive element is operably coupled to peak setting logic for selecting an impedance and a corresponding voltage level at the specified frequency.

18. The XOR logic circuitry of claim 10, further comprising:
a third transconductance stage including a first differential MOSFET pair and a second differential MOSFET pair having gates coupled to receive the first differential input,
wherein the first and second differential MOSFET pair of the third transconductance stage receives opposite phases of the differential inputs relative to the first and second differential MOSFET pair of the second transconductance stage to maintain symmetrical delays through the first and second transconductance stages of the first and second mixers.

19. A method for producing an exclusive OR logic function for high data rate input signals, comprising:
within exclusive OR (XOR) circuitry:
receiving a first differential input signal at a first differential input;
receiving a second differential input signal at a second differential input;
producing a differential logic one if only one of the first and second differential input signals is a logic one;
producing a differential logic zero if one of both or neither of the first and second differential input signals is a logic one; and
setting a peaked response on an output load device coupled to an output of the XOR circuitry to produce an increased output signal magnitude at a frequency that approximately matches a bit rate of at least one of the first and second differential input signals; and
wherein setting the peaked response includes programming a resistance of a first resistive element and coupling the first resistive element in parallel with a second resistive element.

20. The method of claim 19 wherein the first differential input signal is a logic one whenever a first terminal of the first differential input signal has a greater magnitude than a magnitude of a second terminal of the first differential input signal.

21. The method of claim 20 wherein the first differential input signal is a logic zero whenever the magnitude of the second terminal of the first differential input signal is greater than the magnitude of the first terminal of the first differential input signal.

22. The method of claim 21 wherein the second differential input signal is a logic one whenever a first terminal of the second differential input signal has a greater magnitude than a magnitude of a second terminal of the second differential input signal.

23. The method of claim 22 wherein the second differential input signal is a logic zero whenever the magnitude of the second terminal of the second differential input signal is greater than the magnitude of the first terminal of the second differential input signal.

* * * * *